US012751217B2

(12) United States Patent
Song

(10) Patent No.: US 12,751,217 B2
(45) Date of Patent: Sep. 29, 2026

(54) SEMICONDUCTOR DEVICE WITH SELF-SELECTING MEMORY LAYER

(71) Applicant: SK hynix Inc., Icheon-si (KR)

(72) Inventor: Jeong Hwan Song, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 298 days.

(21) Appl. No.: 17/940,615

(22) Filed: Sep. 8, 2022

(65) Prior Publication Data

US 2023/0138698 A1 May 4, 2023

(30) Foreign Application Priority Data

Oct. 29, 2021 (KR) ........................ 10-2021-0146894

(51) Int. Cl.
*H10N 70/00* (2023.01)
*G11C 13/00* (2006.01)

(52) U.S. Cl.
CPC ....... *H10N 70/041* (2023.02); *G11C 13/0038* (2013.01); *G11C 13/004* (2013.01); *G11C 13/0069* (2013.01); *H10N 70/841* (2023.02)

(58) Field of Classification Search
CPC .. H10N 70/041; H10N 70/841; H10N 70/043; H10N 70/25; H10N 70/24; H10N 70/826; H10N 70/8833; H10N 70/245; G11C 13/0038; G11C 13/004; G11C 13/0069; G11C 2013/0092;
(Continued)

(56) References Cited

U.S. PATENT DOCUMENTS 9,595,668 B2 * 3/2017 Govoreanu ........ H10N 70/8833
9,960,350 B2 * 5/2018 Ha ....................... H10N 70/826
(Continued)

FOREIGN PATENT DOCUMENTS

CN 106935702 A 7/2017
CN 112670407 A 4/2021
(Continued)

OTHER PUBLICATIONS

First Office Action for CN Appl. No. 202211323977.8, mailed on Jun. 1, 2026, 24 pages with English translation.

*Primary Examiner* — Allison Bernstein
(74) *Attorney, Agent, or Firm* — Ashurst Perkins Coie US LLP

(57) ABSTRACT

A semiconductor memory may include at least one memory cell. The memory cell may include: a first electrode layer; a second electrode layer separated from the first electrode layer, wherein the first and second electrode layers are coupled to receive a voltage applied to the first and second electrode layers; and a self-selecting memory layer interposed between the first electrode layer and the second electrode layer and configured to store data and operable to disconnect or connect a conducting path between the first electrode layer and the second electrode layer, to respond to the voltage applied to the first and second electrode layers, wherein the self-selecting memory layer includes an insulating material layer, a first dopant that creates a shallow trap providing a path for conductive carriers in the insulating material layer, and a second dopant that is movable in the insulating material layer according to a polarity of the voltage applied to the first and second electrode layers.

14 Claims, 4 Drawing Sheets

(58) Field of Classification Search
CPC ............ G11C 2213/15; G11C 2213/73; G11C 2013/0073; G11C 2013/009; G11C 13/0007; G11C 13/003; G11C 11/1675; G11C 11/1697; H10B 63/80; H10B 63/845; H10B 61/00; G06F 3/0656; G06F 12/08
USPC ............................................................ 365/10
See application file for complete search history.

(56) References Cited

U.S. PATENT DOCUMENTS

| | | | | |
|---|---|---|---|---|
| 10,424,374 | B2 | 9/2019 | Redaelli et al. | |
| 2017/0352807 | A1 | 12/2017 | Ha | |
| 2020/0212168 | A1* | 7/2020 | Yoo | H01L 29/78391 |
| 2021/0273158 | A1* | 9/2021 | Park | H10N 70/826 |
| 2022/0068382 | A1* | 3/2022 | Lin | G11C 7/12 |
| 2023/0136317 | A1* | 5/2023 | Song | G11C 13/0069<br>365/148 |

FOREIGN PATENT DOCUMENTS

| | | | |
|---|---|---|---|
| CN | 112993155 | A | 6/2021 |
| KR | 20170137562 | A | 12/2017 |

* cited by examiner

SEMICONDUCTOR DEVICE WITH SELF-SELECTING MEMORY LAYER

PRIORITY CLAIM AND CROSS-REFERENCE TO RELATED APPLICATION

This patent document claims the priority and benefits of Korean Patent Application No. 10-2021-0146894 filed on Oct. 29, 2021, which is incorporated herein by reference in its entirety.

TECHNICAL FIELD

This patent document relates to memory circuits or devices.

BACKGROUND

The recent trend toward miniaturization, low power consumption, high performance, and multi-functionality in the electrical and electronics industry has compelled the semiconductor manufacturers to focus on, high-performance, high capacity semiconductor devices. Examples of such high-performance, high-capacity semiconductor devices include memory devices that can store data by switching between different resistance states according to an applied voltage or current, for example, an RRAM (resistive random access memory), a PRAM (phase change random access memory), an FRAM (ferroelectric random access memory), an MRAM (magnetic random access memory), an electronic fuse (E-fuse).

SUMMARY

The disclosed technology in this patent document includes various embodiments of an semiconductor device including a memory cell that has a self-selecting memory layer having excellent operating characteristics and an easy manufacturing process.

In an embodiment, a semiconductor device includes a memory cell, which includes: a first electrode layer; a second electrode layer separated from the first electrode layer, wherein the first and second electrode layers are coupled to receive a voltage applied to the first and second electrode layers; and a self-selecting memory layer interposed between the first electrode layer and the second electrode layer and configured to store data and operable to disconnect or connect a conducting path between the first electrode layer and the second electrode layer, to respond to the voltage applied to the first and second electrode layers, wherein the self-selecting memory layer includes an insulating material layer, a first dopant that creates a shallow trap providing a path for conductive carriers in the insulating material layer, and a second dopant that is movable in the insulating material layer according to a polarity of the voltage applied to the first and second electrode layers.

In another embodiment, a semiconductor device includes a memory cell, which includes: a first electrode layer; a second electrode layer; and a self-selecting memory layer interposed between the first electrode layer and the second electrode layer, and including an insulating material layer which exhibits different resistance states for storing data and is structured to be either electrically conductive or electrically non-conductive in response to the voltage applied to the first and second electrode layers, wherein the self-selecting memory layer is structured to turn on when conductive carriers in a deep trap in the insulating material layer transition to a shallow trap while having different resistance states according to movement of ions in the insulating material layer.

DETAILED DESCRIPTION

Hereinafter, various embodiments of the disclosure will be described in detail with reference to the accompanying drawings.

Figure 1:
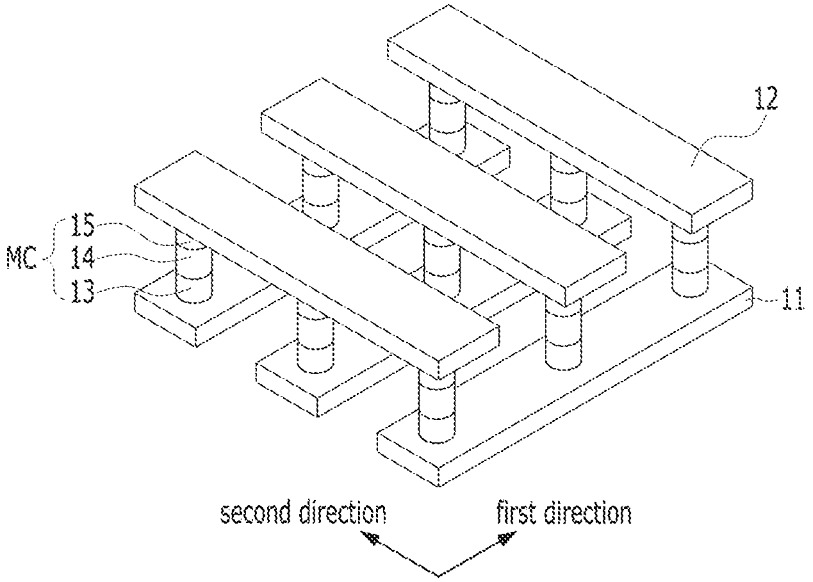
FIG. 1 is a perspective view illustrating a memory device based on some embodiments of the disclosed technology.

FIG. 1 is a perspective view illustrating a memory device based on some embodiments of the disclosed technology.

Referring to FIG. 1, the memory device of the present embodiment may include a plurality of first conductive lines 11 extending in a first direction and parallel to each other, a plurality of second conductive lines 12 extending in a second direction crossing the first direction and parallel to each other while being spaced apart from the first conductive lines 11, and a plurality of memory cells MC interposed between the first conductive lines 11 and the second conductive lines 12 and respectively disposed at intersections of the first conductive lines 11 and the second conductive lines 12.

The memory cell MC may have a pillar shape to be separated from the adjacent memory cell MC. In the present embodiment, the memory cell MC has a cylindrical shape, but the present disclosure is not limited thereto. In another embodiment, the memory cell MC may have a square pillar shape that has both sidewalls aligned with both sidewalls of the second conductive line 12 in the first direction and both sidewalls aligned with both sidewalls of the first conductive line 11 in the second direction.

The memory cell MC may include a first electrode layer 13, a second electrode layer 15, and a self-selecting memory layer 14 interposed between the first electrode layer 13 and the second electrode layer 15. In some implementations, the self-selecting (or self-switching) memory layer 14 can (1) store data based on different resistance values of the layer which are controlled by a voltage or current applied to the memory layer 14 and (2) disconnect (turn off) or connect (turn on) the conducting path through the memory layer 14 between the first electrode layer 13 and the second electrode layer 15, depending on whether the applied voltage or current is above or below a threshold voltage or current.

The first electrode layer 13 and the second electrode layer 15 may be located at both ends, for example, at the lower and upper ends, respectively, of the memory cell MC to transmit a voltage or current required for the operation of the memory cell MC. The first electrode layer 13 and/or the second electrode layer 15 may include various conductive materials, for example, a metal such as platinum (Pt), tungsten (W), aluminum (Al), copper (Cu), tantalum (Ta), titanium (Ti), or others, a metal nitride such as titanium nitride (TiN) and tantalum nitride (TaN), or a combination thereof. Alternatively, the first electrode layer 13 and/or the second electrode layer 15 may include a carbon electrode. At least one of the first electrode layer 13 and the second electrode layer 15 may be omitted. In this case, the first conductive line 11 may function as the first electrode layer 13 instead of the omitted first electrode layer 13, and the second conductive line 12 may function as the second electrode layer 15 instead of the omitted second electrode layer 15.

In some implementations of the disclosed technology, the self-selecting memory layer 14 may be configured to function as both a memory device and a selector or switch device. More specifically, for example, the self-selecting memory layer 14 may function as a memory device by having a variable resistance for storing different data by switching between different resistance states according to a voltage applied to the first electrode layer 13 and the second electrode layer 15. At the same time, the self-selecting memory layer 14 may function as a selector or switch device by performing a threshold switching to block or limit a current flowing through the self-selecting memory layer 14 when a magnitude of an applied voltage is less than a certain threshold value and increase the current flowing through the self-selecting memory layer 14 to a certain level above the threshold value. This threshold value may be referred to as a threshold voltage, and the self-selecting memory layer 14 may be turned-on or turned-off based on the threshold voltage. More specifically, the self-selecting memory layer 14 may be turned-on or turned-off depending on whether the applied voltage or current is above or below the threshold voltage.

In some implementations, the threshold voltage of the self-selecting memory layer 14 for operating as a selector or switch device may vary depending on the resistance state of the self-selecting memory layer 14. That is, the self-selecting memory layer 14 may have different threshold voltages depending on different resistance states. For example, when the self-selecting memory layer 14 is in a low resistance state, it may have a first threshold voltage, and when the self-selecting memory layer 14 is in a high resistance state, it may have a second threshold voltage different from the first threshold voltage. Accordingly, a single self-selecting memory layer 14 can function as a memory device and a selector or switch device at the same time in.

As a result, data can be stored in each of the plurality of memory cells MC including the self-selecting memory layer 14, while reducing or minimizing the current leakage between the memory cells MC sharing the first conductive line 11 or the second conductive line 12.

In some embodiment of the disclosed technology, since the single self-selecting memory layer 14 simultaneously functions as a memory and as a selector or switch, there may be no need to additionally manufacture two separate circuit elements: one memory element for storing data and another selection element for selecting the memory cell. As a result, the overall number of circuit element in a memory cell may be reduced, the circuit configuration may be simplified, the fabrication process can be simplified, and the manufacturing costs may be reduced. In addition, since it is facilitated to implement a memory device having a cross-point structure including the memory cells MC, the degree of integration of the memory device may be secured.

Furthermore, the disclosed technology can be implemented to improve the operating characteristics and simplify the manufacturing process by providing a memory cell that includes a self-selecting memory layer, which can function as both the memory and the selector (or switch).

Figure 2:
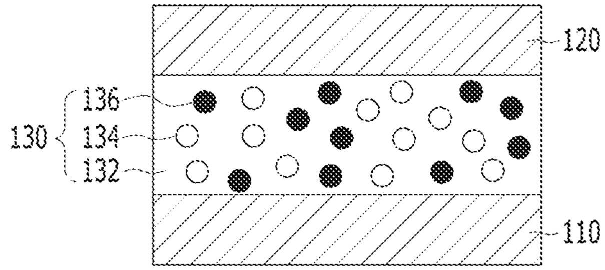
FIG. 2 is a cross-sectional view illustrating a memory cell based on some embodiments of the disclosed technology.

FIG. 2 is a cross-sectional view illustrating a memory cell based on some embodiments of the disclosed technology.

Referring to FIG. 2, the memory cell based on some embodiment may include a first electrode layer 110, a second electrode layer 120, and a self-selecting memory layer 130 interposed between the first electrode layer 110 and the second electrode layer 120 to store data based on different resistance values and to be conductive or non-conductive based on whether the applied voltage is above or below a threshold voltage.

The first electrode layer 110 and/or the second electrode layer 120 may include various conductive materials, for example, a metal such as platinum (Pt), tungsten (W), aluminum (Al), copper (Cu), tantalum (Ta), and titanium (Ti), a metal nitride such as titanium nitride (TiN) and tantalum nitride (TaN), or a combination thereof. Alternatively, the first electrode layer 110 and/or the second electrode layer 120 may include a carbon electrode. One of the first electrode layer 110 and the second electrode layer 120 may correspond to the first electrode layer 13 or the first conductive line 11 of FIG. 1 described above, and the other may correspond to the second electrode layer 15 or the second conductive line 12 of FIG. 1 described above.

The self-selecting memory layer 130 may include an insulating material layer 132, a first dopant 134, and a second dopant 136. The first dopant 134 and the second dopant 136 may be doped into the insulating material layer 132 by ion implantation or others.

The insulating material layer 132 may include a silicon-containing insulating material such as silicon oxide, silicon nitride, or silicon oxynitride. Alternatively, as another example, the insulating material layer 132 may include insulating metal oxide, insulating metal nitride, or a combination thereof. As the insulating metal oxide, for example, aluminum oxide may be used, and as the insulating metal nitride, for example, aluminum nitride may be used. A deep trap capable of trapping electrons may exist in the insulating material layer 132. The energy level of the deep trap may be similar to the energy level of a valence band of the insulating material layer 132.

In some implementations, the first dopant 134 can create a shallow trap providing a path for conductive carriers, e.g., electrons in the insulating material layer 132, without itself being substantially mobile within the insulating material layer 132. The energy level of the shallow trap generated by the first dopant 134 may be greater than the energy level of the deep trap of the insulating material layer 132. In addition, the energy level of the shallow trap may be greater than the work function of at least one of the first and second electrode layers 110 and 120 and smaller than the energy level of a conduction band of the insulating material layer 132. In order to generate the shallow trap, various elements that are different from the constituent elements of the insulating material layer 132 and generate an energy level capable of accommodating the conductive carriers in the insulating material layer 132 may be used as the first dopant 134. For example, the first dopant 134 may include aluminum (Al), lanthanum (La), niobium (Nb), vanadium (V), tantalum (Ta), tungsten (W), chromium (Cr), molybdenum (Mo), boron (B), nitrogen (N), carbon (C), phosphorus (P), arsenic (As), titanium (Ti), copper (Cu), zirconium (Zr), hafnium (Hf), or a combination thereof.

When a voltage equal to or greater than the threshold voltage is applied to the self-selecting memory layer 130, the conductive carriers trapped in the deep trap may jump to the shallow trap by thermal emission or tunneling, and thus, the conductive carriers may move through the shallow trap.

Accordingly, the self-selecting memory layer 130 has an "ON" state that allows a current to flow through the self-selecting memory layer 130 between the first electrode layer 110 and the second electrode layer 120. On the other hand, when the voltage applied to the self-selecting memory layer 130 falls below the threshold voltage, the number of conductive carriers moving from the deep trap to the shallow trap may decrease, and thus, the movement of the conductive carriers through the shallow trap may be suppressed. Accordingly, the self-selecting memory layer 130 has an "OFF" state that does not allow a current to flow through the self-selecting memory layer 130 between the first electrode layer 110 and the second electrode layer 120. In some embodiments of the disclosed technology, the threshold voltage of the self-selecting memory layer 130 may vary depending on the resistance state of the self-selecting memory layer 130 according to the movement of the second dopant 136, as will be discussed below. For example, when the self-selecting memory layer 130 has a first resistance state due to the concentration of the second dopant 136 in a first region, the self-selecting memory layer 130 may have a first threshold voltage. On the other hand, when the self-selecting memory layer 130 has a second resistance state due to the concentration of the second dopant 136 in a second region, the self-selecting memory layer 130 may have a second threshold voltage different from the first threshold voltage. The threshold voltage of the self-selecting memory layer 130 can vary depending on where in the self-selecting memory layer 130 the second dopant 136 is concentrated, which affects the jumping of conductive carriers from the deep trap to the shallow trap in the insulating material layer 132. That is, the amount/number of conductive carriers jumping from the deep trap to the shallow trap when the second dopant 136 is concentrated in the first region may be different from the amount/number of conductive carriers jumping from the deep trap to the shallow trap when the second dopant 136 is concentrated in the second region.

In some implementations, the second dopant 136 is movable in the insulating material layer 132 according to the polarity of the voltage applied to the memory cell, and thus, they may be concentrated at a portion of the insulating material layer 132 at the interface region between the first electrode layer 110 and the insulating material layer 132 and/or at the region adjacent to the first electrode layer 110, or be concentrated at the interface region between the second electrode layer 120 and the insulating material layer 132 and/or at the region adjacent to the second electrode layer 120. Hereinafter, the portion of the insulating material layer 132 at the interface region between the first electrode layer 110 and the insulating material layer 132 and/or at the region adjacent to the first electrode layer 110 will be referred to as a first region, and the portion of the insulating material layer 132 at the interface region between the second electrode layer 120 and the insulating material layer 132 and/or at the region adjacent to the second electrode layer 120 will be referred to as a second region. The self-selecting memory layer 130 may exhibit different resistance states depending on the region where the second dopant 136 is concentrated. In one example, when the second dopant 136 is concentrated in the first region, the self-selecting memory layer 130 may have a low resistance state, and when the second dopant 136 is concentrated in the second region, the self-selecting memory layer 130 may have a high resistance state. In another example, when the second dopant 136 is concentrated in the first region, the self-selecting memory layer 130 may have a high resistance state, and when the second dopant 136 is concentrated in the second region, self-selecting memory layer 130 may have a low resistance state.

In order to move toward different directions at different polarities, ions having a predetermined polarity may be used as the second dopant 136. Furthermore, an element having relatively high diffusivity/mobility in the insulating material layer 132 may be used as the second dopant 136. The diffusivity/mobility of the second dopant 136 in the insulating material layer 132 may be greater than that of the first dopant 134. As an example, the second dopant 136 may include hydrogen (H) or an alkali metal such as lithium (Li), sodium (Na), or potassium (K). FIG. 2 shows the state immediately after the formation of the memory cell, that is, the initial state before the operating voltage is applied to the first and second electrode layers 110 and 120, and the second dopant 136 may be randomly distributed within the insulating material layer 132 in this state. The movement of the second dopant 136 will be described in more detail with reference to FIGS. 3A and 3B.

Figure 3A:
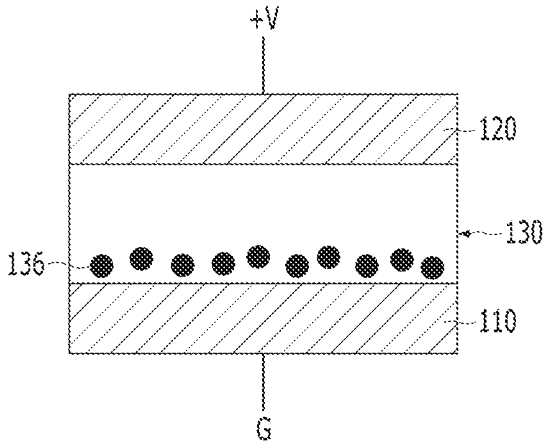
FIGS. 3A and 3B illustrate how second dopants move depending on a voltage applied to the memory cell of FIG. 2.
Figure 3B:
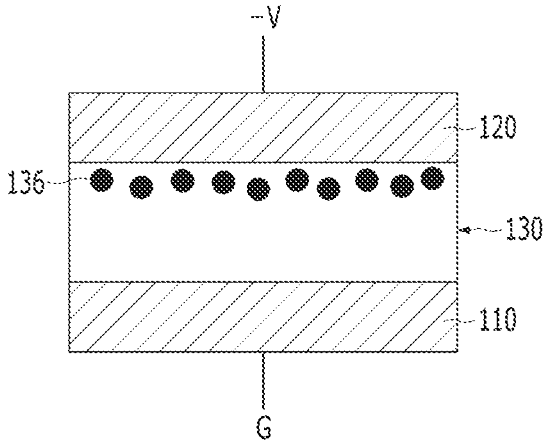

FIGS. 3A and 3B are views illustrating how the second dopants move depending on a voltage applied to the memory cell of FIG. 2. In these figures, a case has been described in which the second dopant 136 includes cations, such as positively charged hydrogen ions (H+), lithium ions (Li+), sodium ions (Na+), potassium ions (K+), or others. In addition, illustration of the first dopant 134 of the memory cell of FIG. 2 is omitted in these figures.

Referring to FIG. 3A, a write operation may be performed by applying a write voltage to the first and second electrode layers 110 and 120 of the memory cell. To this end, a positive voltage (e.g., relatively positive) may be applied to the second electrode layer 120 compared to the first electrode layer 110. For example, a ground voltage may be applied to the first electrode layer 110, and a write voltage indicated by +V may be applied to the second electrode layer 120.

Under the applied positive voltage on the electrode layer 120 relative the electrode layer 110, the second dopant 136 exhibiting a positive charge may move in a direction toward the first electrode layer 110 and may be concentrated in a region adjacent to the first electrode layer 110. In this case, the self-selecting memory layer 130 may have a first resistance state. Furthermore, the self-selecting memory layer 130 in the first resistance state may have a first threshold voltage. As an example, the first resistance state may be a low resistance state. That is, the write operation may correspond to changing the resistance state of the self-selecting memory layer 130 to a low resistance state.

Referring to FIG. 3B, an erase operation may be performed by applying an erase voltage to the first and second electrode layers 110 and 120 of the memory cell. To this end, a relatively negative voltage may be applied to the second electrode layer 120 compared to the first electrode layer 110. For example, a ground voltage may be applied to the first electrode layer 110, and an erase voltage indicated by −V may be applied to the second electrode layer 120. The erase voltage may be a voltage having the same magnitude as the write voltage and having a polarity opposite to that of the write voltage.

In this case, the second dopant 136 may move in a direction toward the second electrode layer 110 and may be concentrated in a region adjacent to the second electrode layer 110. In this case, the self-selecting memory layer 130 may have a second resistance state different from the first resistance state. Furthermore, the self-selecting memory layer 130 in the second resistance state may have a second threshold voltage different from the first threshold voltage. As an example, the second resistance state may be a high resistance state. That is, the erase operation may correspond to changing the resistance state of the self-selecting memory layer 130 to the high resistance state. Also, as an example, the magnitude of the second threshold voltage may be greater than the magnitude of the first threshold voltage.

Figure 4:
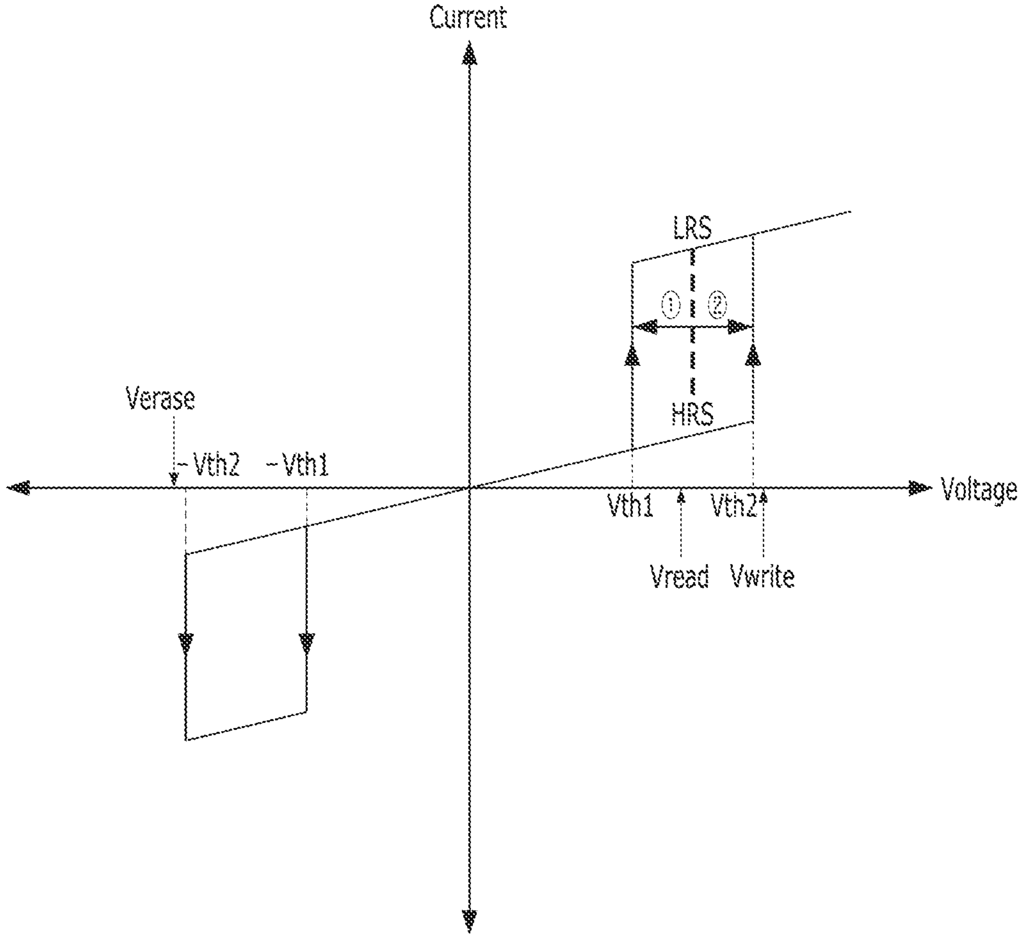
FIG. 4 is a current-voltage graph of the memory cell of FIG. 2.

FIG. 4 is a current-voltage graph of the memory cell of FIG. 2. In particular, FIG. 4 illustrates the write operation of FIG. 3A and the erase operation of FIG. 3B. For reference, the write operation of FIG.

3A may indicate transitioning the self-selecting memory layer to a low resistance state and a relatively small first threshold voltage by applying a positive write voltage, and the erase operation of FIG. 3B may indicate transitioning the self-selecting memory layer to a high resistance state and a relatively large second threshold voltage by applying a negative erase voltage.

Referring to FIG. 4, when the voltage applied to both ends or terminals of the memory cell in the high resistance state HRS is increased in the positive direction to reach the positive second threshold voltage Vth2, the memory cell may be turned on, and may also be switched from the high resistance state HRS to the low resistance state LRS. When the memory cell is transitioned to the low resistance state LRS, the memory cell may have the first threshold voltage Vth1 having a lower magnitude than that of the second threshold voltage Vth2. Here, the magnitude of the voltage may indicate an absolute value irrespective of the positive and negative directions.

Conversely, when the voltage applied to both ends or terminals of the memory cell in the low resistance state LRS is increased in the negative direction to reach the negative first threshold voltage −Vth1, the memory cell may be turned on, and may also be switched from the low resistance state LRS to the high resistance state HRS. When the memory cell is transitioned to the high resistance state HRS, the memory cell may have the second threshold voltage Vth2 having a magnitude greater than that of the first threshold voltage Vth1.

In this manner, the memory cell may switch between the low resistance state LRS and the high resistance state HRS.

The write operation and the erase operation on the memory cell may be performed using voltages having the same magnitude and opposite polarities. Accordingly, a positive write voltage Vwrite having a magnitude greater than or equal to the second threshold voltage Vth2 may be applied during the write operation, and a negative erase voltage Verase having a magnitude greater than or equal to the second threshold voltage Vth2 may be applied during the erase operation. Here, the write voltage Vwrite may correspond to a voltage indicated by +V in FIG. 3A, and the erase voltage Verase may correspond to a voltage indicated by −V in FIG. 3B.

During a read operation, a read voltage Vread having a magnitude between the first threshold voltage Vth1 and the second threshold voltage Vth2 may be applied. In particular, in some embodiments of the disclosed technology, a positive read voltage Vread may be applied. This is because the self-selecting memory layer may be changed from the low resistance state LRS to the high resistance state HRS at the negative first threshold voltage Vth1. If a negative read voltage of the same magnitude as the positive read voltage Vread is applied, a read operation can result in undesirably changing the resistance state of the memory cell from the low resistance state LRS to the high resistance state HRS during the read operation.

A dotted line indicated between the arrows "①" and "②" in FIG. 4 shows an operation of a device in another example in which a first dopant for forming a shallow trap is doped in an insulating layer. In such an example, since the second dopant is absent and there is no change in the resistance state of the memory cell according to the second dopant, only a selection or switching function (turn-on/turn-off) may be performed. On the other hand, in a case of a device that is doped with a first dopant for forming a shallow trap in an insulating layer and a movable second dopant based on some embodiments of the disclosed technology, the threshold voltage may decrease (e.g., arrow "①") or increase (e.g., arrow "②") depending on the concentration region of the second dopant, and accordingly, a difference in resistance state can be detected, and thus both the selection/switch function and the memory function may be performed. Furthermore, the self-selecting memory layer may be formed by doping different dopants into the insulating layer by ion implantation or another impurity doping process.

FIGS. 3A, 3B, and 4 show, during the write operation, the self-selecting memory layer has the low resistance state and the relatively small first threshold voltage by applying the positive write voltage, and during the erase operation, the self-selecting memory layer has the high resistance state and the relatively large second threshold voltage by applying the negative erase voltage, but the disclosed technology is not limited thereto. The embodiments discussed above may be modified as long as the resistance state and the threshold voltage state of the self-selecting memory layer vary according to the movement of the second dopant in the insulating material layer. For example, by applying a negative write voltage, a write operation may be performed to transition a self-selecting memory layer to a low resistance state and a relatively small first threshold voltage, and by applying a positive erase voltage, an erase operation may be performed to transition the self-selecting memory layer to a high resistance state and a relatively large second threshold voltage. Alternatively, for example, a self-selecting memory layer may have a low resistance state and a relatively large first threshold voltage, or a high resistance state and a relatively small second threshold voltage. That is, by applying a positive or negative write voltage, a write operation is performed to transition the self-selecting memory layer to the low resistance state and the relatively large first threshold voltage, and by applying a negative or positive erase voltage, an erase operation is performed to transition the self-selecting memory layer to the high resistance state and the relatively small second threshold voltage.

In some implementations, in order to maximize the movement of the second dopant during the write operation or the erase operation and at the same time to minimize the movement of the second dopant during the read operation, the difference between the magnitude of the write voltage or the erase voltage and the magnitude of the read voltage is maximized. In some implementations, the pulse width of the write voltage or the erase voltage is larger than the pulse width of the read voltage, as will be discussed below with reference to FIG. 5.

Figure 5:
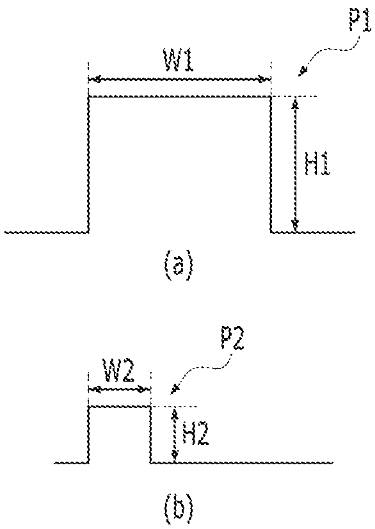
FIG. 5 illustrates (a) a voltage pulse applied during a write operation or an erase operation of the memory cell of FIG. 2 and (b) a voltage pulse applied during a read operation.

FIG. 5 illustrates (a) a voltage pulse applied during a write operation or an erase operation of the memory cell of FIG. 2 and (b) a voltage pulse applied during a read operation.

FIG. 5(*a*) shows a first voltage pulse P1 applied during a write operation or an erase operation of a memory cell. Here, the magnitude and width of the first voltage pulse P1 are denoted by H1 and W1, respectively.

FIG. 5(*b*) shows a second voltage pulse P2 applied during a read operation of a memory cell. Here, the magnitude and width of the second voltage pulse P2 are denoted by H2 and W2, respectively.

Here, the magnitude H1 of the first voltage pulse P1 may have a value ranging from 2 times of the magnitude H2 of the second voltage pulse P2 to 5 times of the magnitude H2 of the second voltage pulse P2. If the magnitude H1 of the first voltage pulse P1 exceeds 5 times of the magnitude H2 of the second voltage pulse P2, the memory cell may be damaged due to the high voltage application. If the magnitude H1 of the first voltage pulse P1 is less than 2 times of the magnitude H2 of the second voltage pulse P2, the movement of the second dopant for the write/erase operation may be insufficient.

Also, the width W1 of the first voltage pulse P1 may be greater than the width W2 of the second voltage pulse P2 because the movement of the second dopant is not affected as the width of the applied voltage pulse is shorter. Accordingly, the width W1 of the first voltage pulse P1 may be relatively large to induce sufficient movement of the second dopant for the write/erase operation, and the width W2 of the second voltage pulse P2 may be relatively small to prevent the second dopant from moving during the read operation.

In some implementations, the width W1 of the first voltage pulse P1 may have a value ranging from 10 times of the width W2 of the second voltage pulse P2 to 1000 times of the width W2 of the second voltage pulse P2.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few embodiments and examples are described. Enhancements and variations of the disclosed embodiments and other embodiments can be made based on what is described and illustrated in this patent document.

What is claimed is:

1. A semiconductor device comprising at least one memory cell, the at least one memory cell comprising:

a first electrode layer;

a second electrode layer separated from the first electrode layer, wherein the first and second electrode layers are coupled to receive a voltage applied to the first and second electrode layers; and a self-selecting memory layer interposed between the first electrode layer and the second electrode layer and configured to store data and operable to disconnect or connect a conducting path between the first electrode layer and the second electrode layer, to respond to the voltage applied to the first and second electrode layers, wherein the self-selecting memory layer is formed as a single insulating material layer doped with a first dopant and a second dopant, wherein the first dopant includes one or more elements to create a shallow trap having an energy level capable of providing a path for conductive carriers in the insulating material layer, and the second dopant is movable in the insulating material layer according to a polarity of the voltage applied to the first and second electrode layers, wherein the first dopant includes at least one of aluminum (Al), lanthanum (La), niobium (Nb), vanadium (V), tantalum (Ta), tungsten (W), chromium (Cr), molybdenum (Mo), boron (B), nitrogen (N), carbon (C), phosphorus (P), arsenic (As), titanium (Ti), copper (Cu), zirconium (Zr), hafnium (Hf), or a combination of two or more of aluminum (Al), lanthanum (La), niobium (Nb), vanadium (V), tantalum (Ta), tungsten (W), chromium (Cr), molybdenum (Mo), boron (B), nitrogen (N), carbon (C), phosphorus (P), arsenic (As), titanium (Ti), copper (Cu), zirconium (Zr), or hafnium (Hf).

2. The semiconductor device according to claim 1, wherein a mobility of the second dopant is greater than a mobility of the first dopant.

3. The semiconductor device according to claim 1, wherein the second dopant includes hydrogen ions or alkali metal ions.

4. The semiconductor device according to claim 1, wherein an energy level of the shallow trap is greater than an energy level of a deep trap having an energy level capable of trapping conductive carriers in the insulating material layer.

5. The semiconductor device according to claim 1, wherein the self-selecting memory layer is configured to switch between a low resistance state and a high resistance state, and a first threshold voltage of the self-selecting memory layer in the low resistance state is different from a second threshold voltage of the self-selecting memory layer in the high resistance state.

6. The semiconductor device according to claim 5, wherein the second dopant of the self-selecting memory layer in the low resistance state is closer to the first electrode layer than to the second electrode layer, and the second dopant of the self-selecting memory layer in the high resistance state is closer to the second electrode layer than to the first electrode layer.

7. The semiconductor device according to claim 5, wherein resistance state of the self-selecting memory layer is changed from the high resistance state to the low resistance state at a write voltage having a first polarity, and is changed from the low resistance state to the high resistance state at an erase voltage having a second polarity different from the first polarity.

8. The semiconductor device according to claim 7, wherein a magnitude of the write voltage and a magnitude of the erase voltage are the same.

9. The semiconductor device according to claim 7, wherein a magnitude of the write voltage and a magnitude of the erase voltage are equal to or greater than a magnitude of a larger one of the first and second threshold voltages.

10. The semiconductor device according to claim 7, wherein the data stored in the memory cell is read out during a read operation by applying a read voltage having a magnitude between the first threshold voltage and the second threshold voltage to determine a resistance state of the self-selecting memory layer.

11. The semiconductor device according to claim 10, wherein a magnitude of the read voltage is larger than two times of the write voltage or the erase voltage and smaller than five times of a magnitude of the write voltage or the erase voltage.

12. The semiconductor device according to claim 10, wherein a pulse width of the read voltage is smaller than a pulse width of the write voltage or the erase voltage.

13. A semiconductor device comprising at least one memory cell, the at least one memory cell comprising:

a first electrode layer;

a second electrode layer; and a self-selecting memory layer interposed between the first electrode layer and the second electrode layer, and formed as a single insulating material layer doped with a dopant including one or more elements to create a shallow trap, wherein the self-selecting memory layer exhibits different resistance states for storing data and is structured to be either electrically conductive or electrically non-conductive in response to a voltage applied to the first and second electrode layers, wherein the self-selecting memory layer is structured to turn on when conductive carriers in a deep trap having an energy level capable of trapping conductive carriers in the insulating material layer transition to the shallow trap having an energy level capable of providing a path for conductive carriers in the insulating material layer while having different resistance states according to movement of ions in the insulating material layer, and wherein the dopant includes at least one of aluminum (Al), lanthanum (La), niobium (Nb), vanadium (V), tantalum (Ta), tungsten (W), chromium (Cr), molybdenum (Mo), boron (B), nitrogen (N), carbon (C), phosphorus (P), arsenic (As), titanium (Ti), copper (Cu), zirconium (Zr), hafnium (Hf), or a combination of two or more of aluminum (Al), lanthanum (La), niobium (Nb), vanadium (V), tantalum (Ta), tungsten (W), chromium (Cr), molybdenum (Mo), boron (B), nitrogen (N), carbon (C), phosphorus (P), arsenic (As), titanium (Ti), copper (Cu), zirconium (Zr), or hafnium (Hf).

14. The semiconductor device according to claim 13, wherein an amount of the conductive carriers transitioning from the deep trap to the shallow trap when the ions are closer to the first electrode layer than to the second electrode layer is different from an amount of the conductive carriers transitioning from the deep trap to the shallow trap when the ions are closer to the second electrode layer than to the first electrode layer.

* * * * *